United States Patent [19]

Kodai et al.

[11] Patent Number: 4,695,925
[45] Date of Patent: Sep. 22, 1987

[54] IC CARD

[75] Inventors: Syojiro Kodai; Noriaki Fujii; Hiroshi Gamo, all of Itami; Bujirou Kobayashi, Tokyo, all of Japan

[73] Assignee: Mitsubishi Denki Kabushiki Kaisha, Tokyo, Japan

[21] Appl. No.: 913,365

[22] Filed: Sep. 30, 1986

[30] Foreign Application Priority Data

Sep. 30, 1985 [JP] Japan ................................ 60-218624

[51] Int. Cl.$^4$ .............................................. H05K 1/14
[52] U.S. Cl. .................................... 361/395; 439/131; 439/892; 439/137
[58] Field of Search ...................... 361/395, 397, 399; 339/2, 34, 36

[56] References Cited

U.S. PATENT DOCUMENTS 262,301 8/1882 Mann ..................................... 339/36
3,926,494 12/1975 Maillaro ................................ 339/34

Primary Examiner—Robert S. Macon
Attorney, Agent, or Firm—Birch, Stewart, Kolasch & Birch

[57] ABSTRACT

An IC card used for conducting a transfer of information through a connector to a card reading out device is provided with electrode terminals for connection to the outside. A shutter is slidably provided within said card so as to cover said electrode terminals in the usual state. A hole provided at the front portion of said card receives a projection provided at said connector when the projection is inserted into the card. The shutter is retreated when it comes into contact with the projection of the connector thereby to expose said electrode terminals when the card is inserted into the connector.

6 Claims, 8 Drawing Figures

IC CARD

FIELD OF THE INVENTION

The present invention relates to an IC card, and more particularly to one in which the electrode terminals are protected by being covered by a shutter in the non-use state and are exposed to enable electrical connections with the outside only when the IC card is inserted into a connector. This IC card has a construction such that reverse insertion is prevented.

BACKGROUND OF THE INVENTION

Recently, an IC card is used instead of a magnetic stripe card. Such an IC card includes a semiconductor element such as a memory IC or CPU in the card in itself, and this increases memory beyond that of a conventional magnetic stripe card by more than several figures. Furthermore, an arbitrary operation function or recognition function can be realized.

FIG. 7 shows a prior art IC card and FIG. 8 shows a cross-sectional view thereof. The reference numeral 3 designates an electrode terminal which is in itself embedded in the card in itself 1 together with a mounting substrate 2. This electrode terminal 3 is exposed by a terminal window in card 1. The reference numeral 4 designates an IC module mounted on the substrate 2.

In this prior art IC card, the electrode terminals are exposed to the outside, and these terminals are likely to be contaminated, thereby resulting in a malfunction. Furthermore, when a person charged with static electricity comes into contact with the teminals, the IC chip provided therein may be electrostatically destroyed.

SUMMARY OF THE INVENTION

It is an object of the present invention to provide an improved IC card capable of preventing contamination of the terminals and electrostatic destruction of the IC chip and having a high reliability.

Other objects and advantages of the present invention will become apparent from the detailed description given hereinafter. It should be understood, however, that the detailed description and specific embodiment are given by way of illustration only, since various changes and modifications within the spirit and scope of the invention will become apparent to those skilled in the art from this detailed description.

According to the present invention, there is provided an IC card used for conducting a transfer of information through a connector between itself and a card reading out device, which provided with electrode terminals for connection to the outside, comprises: a shutter provided slidably within said card in itself so as to cover said electrode terminals in the usual state; a hole provided at the front portion of said card in itself into which a projection provided at said connector is inserted at the insertion of said card into said connector; and said shutter being retreated by becoming in contact with said projection of said connector thereby to expose said electrode terminals when said card is inserted into said connector.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
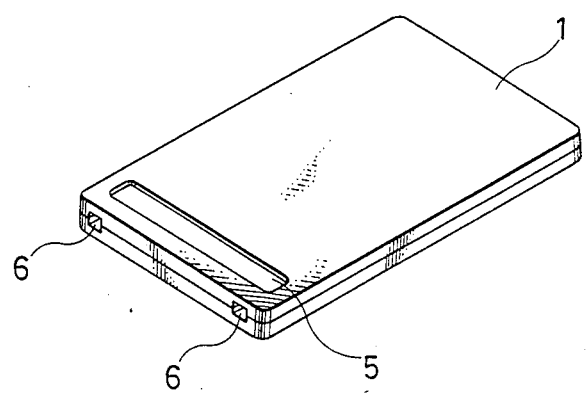
FIG. 1 is a perspective view showing an IC card of an embodiment of the present invention.
Figure 2:
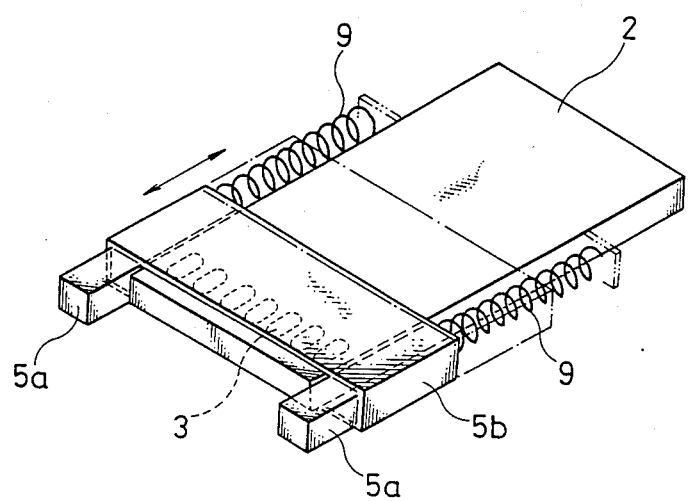
FIG. 2 is an analytical perspective view thereof.
Figure 3:
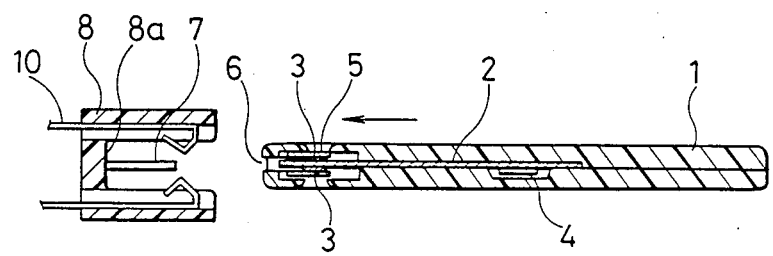
FIG. 3 is a cross-sectional view showing the IC card of the embodiment and a connector of an external reading out device.
Figure 4:
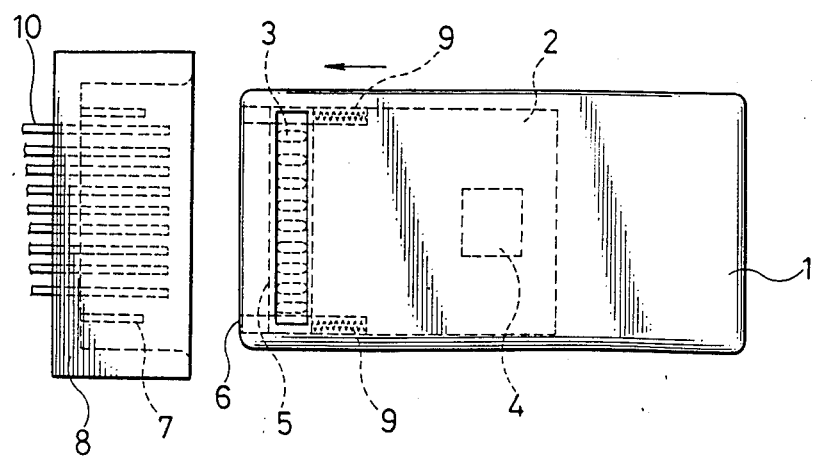
FIG. 4 is a plan view thereof.

In order to explain the present invention in detail, reference will be particularly made to FIGS. 1 to 4.

In these Figures the reference numeral 1 designates a card and the reference numeral 2 designates a mounting substrate embedded the card in 1. The reference numeral 3 designates an electrode terminal positioned at the electrode window portion provided on the both the upper an lower surfaces of the card 1. The reference numeral 5 designates a shutter provided slidably inside the card in 1 so as to cover the electrode terminals. This shutter 5 comprises a shutter film 5b and two shutter push pins 5a provided integrally with the shutter film 5b. The reference numeral 6 designates an insertion hole for opening the shutter 5 provided at the left and right side of the front portion of the card 1, and the shutter push pin 5a is usually inserted into this insertion hole 6. The reference numeral 9 designates a spring provided inside the card 1 for urging the shutter 5 to a position covering the electrode terminals 3. Furthermore, the reference numeral 8 designates a connector of an external card reading out device into which the IC card is to be inserted. The reference numeral 7 designates a shutter opening pin provided at the concave portion 8a of the connector 8, and the reference numeral 10 designates a contact lead.

First of all, when the IC card is not inserted into the connector 8, that is, in the usual state, the shutter 5 is urged by the spring 9 to a position covering the electrode terminals 3. Accordingly, the electrode terminals 3 are covered by the shutter 5, and they are protected from outside dust and other contaminants.

When the card is inserted into the connector of the external card reading out device, that is, when the card is used, the shutter opening pin 7 of the connector 8 is inserted into the insertion hole 6 of the card, and the shutter 5 is retracted as the shutter push pin 5a is pushed by the shutter opening pin 7. Thus, the electrode terminals 3 are exposed to the outside, the contact leads 10 of the external card reading out device are connected with the electrode terminals 3, and thus, transfers of information are conducted between the card and the card reading out device.

Figure 5:
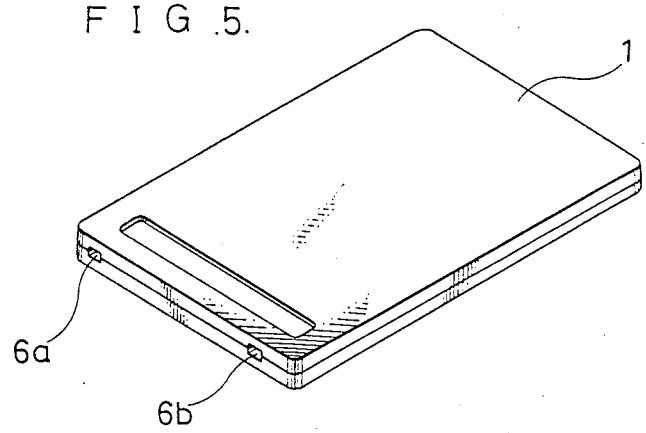
FIG. 5 is a perspective view showing another embodiment of the present invention.
Figure 6:
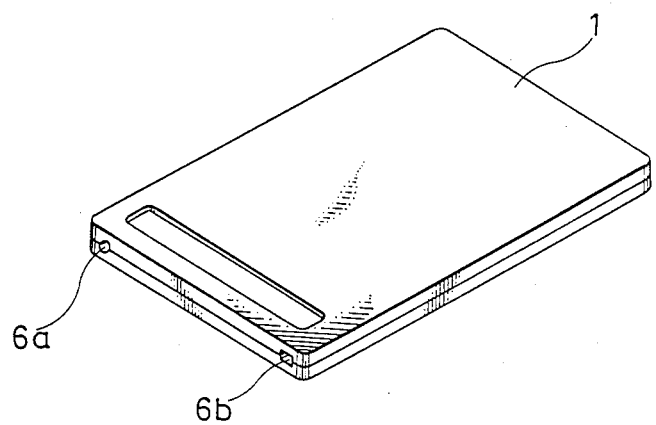
FIG. 6 is a perspective view showing the other embodiment of the present invention.
Figure 7:
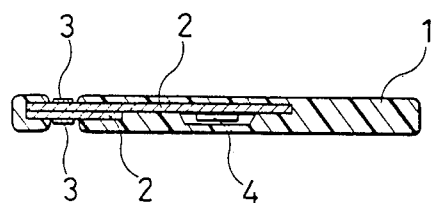
FIG. 7 is a cross-sectional view showing a prior art IC card.
Figure 8:
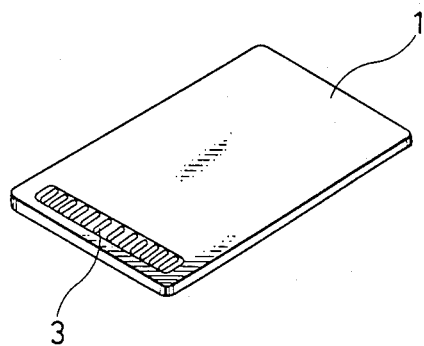
FIG. 8 is a perspective view thereof.

Furthermore, the combination of the insertion hole 6 provided at the card and the shutter opening pin 7 provided at the connector 8 functions not only to open or close the shutter but also to keep the precise positional relationship between the connector and the card. That is, the pin 7 functions as a guide pin, and when it is inserted into the insertion hole 6 of the card, it is positioned at a precise position. Accordingly the positions of the electrode terminals 3 of the card and those of the contact leads 10 of the connector 8 precisely coincide with each other. Furthermore, it is possible to prevent the reverse insertion of the card 1 into the connector 8 with the upper and the lower surface of the card 1 being upset by providing the insertion holes 6a and 6b at unsymmetric positions relative to the center line of the card 1 as shown in FIG. 5 or by differentiating the configurations or the sizes of the insertion holes 6a and 6b as shown in FIG. 6.

In the above-illustrated embodiment the terminals are provided on both surfaces of the card, but the terminals can be provided at only one surface thereof.

As evident from the foregoing description, according to the present invention, a shutter is slidably provided so as to cover the electrode terminals, thereby the preventing of contamination of the electrode terminals and the electrostatic destruction of the IC chip. Such is accomplished by a simple construction. Furthermore, an insertion hole is produced at the front portion of the card such that a projection provided at the connector is inserted thereinto when the card is inserted into the connector and such that the shutter is retreated by that projection, whereby the surfaces of the electrode terminals of the card are exposed to the outside during usage. Thus, the card has no inconvenience in the use of the card similarly as the prior art card, thereby resulting in a high reliability IC card system. The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An IC card used for conducting a transfer of information through a connector to a card reading out device, said card being provided with electrode terminals for connection to the outside, said card comprises:
   a slidable shutter within said card for covering said electrode terminals in a usual state;
   a hole provided at a front portion of said card, said hole receives a projection provided at said connector when said card is inserted into said connector; and
   said shutter being retreated when said projection of said connector comes into contact therewith thereby exposing said electrode terminals when said card in inserted into said connector.

2. An IC card as defined in claim 1, wherein said shutter is urged in said usual state to be located at a position covering said electrode terminals by a spring embedded in said card.

3. An IC card as defined in claim 1, wherein two holes are provided unsymmetrically with respect to the center line of said card.

4. An IC card as defined in claim 2, wherein two holes are provided unsymmetrically with respect to the center line of said card.

5. An IC card as defined in claim 1, wherein there are provided two holes which have different configurations or different sizes.

6. An IC card as defined in claim 2, wherein there are provided two holes which have different configurations or different sizes.

* * * * *